US008179029B2

(12) United States Patent
Boerner et al.

(10) Patent No.: US 8,179,029 B2
(45) Date of Patent: May 15, 2012

(54) LIGHT EMITTING DEVICE INCLUDING MULTIPLE OLEDS

(75) Inventors: Herbert Friedrich Boerner, Aachen (DE); Stefan Peter Grabowski, Aachen (DE); Hans Helmut Bechtel, Roetgen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 365 days.

(21) Appl. No.: 12/278,955

(22) PCT Filed: Feb. 7, 2007

(86) PCT No.: PCT/IB2007/050403
§ 371 (c)(1),
(2), (4) Date: Aug. 11, 2008

(87) PCT Pub. No.: WO2007/091215
PCT Pub. Date: Aug. 16, 2007

(65) Prior Publication Data
US 2010/0164344 A1    Jul. 1, 2010

(30) Foreign Application Priority Data
Feb. 7, 2006   (EP) .................................... 06101522

(51) Int. Cl.
*H01J 61/94* (2006.01)
*H01L 51/50* (2006.01)
*H01L 51/52* (2006.01)
(52) U.S. Cl. .............................. 313/1; 313/512; 313/503
(58) Field of Classification Search .................. None
See application file for complete search history.

(56) References Cited

U.S. PATENT DOCUMENTS

| 5,258,323 | A | 11/1993 | Sarma et al. |
| 5,912,649 | A | 6/1999 | Hattori et al. |
| 6,809,709 | B2 | 10/2004 | Uchida et al. |
| 2002/0149009 | A1 | 10/2002 | Uchida |
| 2004/0036412 | A1 | 2/2004 | Takamura |
| 2004/0183434 | A1 | 9/2004 | Yeh et al. |
| 2005/0077817 | A1 | 4/2005 | Yamazaki et al. |
| 2006/0017379 | A1 | 1/2006 | Su et al. |
| 2007/0114522 | A1* | 5/2007 | Kwok et al. ............... 257/40 |

FOREIGN PATENT DOCUMENTS

| CN | 1376015 A | 10/2002 |
| EP | 1575337 A2 | 9/2005 |
| JP | 1012378 A | 1/1989 |

(Continued)

OTHER PUBLICATIONS

Written Opinion.

*Primary Examiner* — Toan Ton
*Assistant Examiner* — Britt D Hanley (57) ABSTRACT

The present invention relates to a light emitting device (30) having at least a first (10) and a second light emitting element (20), with the first light emitting element (10) emitting a first light (1) and the second light emitting element (20) emitting a second light (2), each light emitting element (10,20) being an OLED (10,20), the OLED (10,20) comprising a sandwich structure with a substrate (14,24), a first (11,21) and a second electrode (12,22) and an organic layer (13,23) being provided between the first (11,21) and the second electrode (12,22), a light (3) leaving the light emitting device (30), wherein at least a part of said light (3) is provided by a superposition of the first (1) and the second light (2).

18 Claims, 5 Drawing Sheets

FOREIGN PATENT DOCUMENTS

| | | |
|---|---|---|
| JP | 7272848 A | 10/1995 |
| JP | 8153586 A | 6/1996 |
| JP | 2000100560 A | 4/2000 |
| JP | 2001357976 A | 12/2001 |
| JP | 2004265763 A | 9/2004 |
| JP | 2005275298 A1 | 10/2005 |
| RU | 2121733 C1 | 11/1998 |
| RU | 2266570 C1 | 12/2005 |
| WO | 2005086257 A1 | 9/2005 |

\* cited by examiner

FIG. 5e

LIGHT EMITTING DEVICE INCLUDING MULTIPLE OLEDS

This invention relates to a light emitting device having at least a first and a second light emitting element, with the first light emitting element emitting a first light and the second light emitting element emitting a second light, each light emitting element being an OLED, the OLED comprising a sandwich structure with a substrate, a first and a second electrode and an organic layer being provided between the first and the second electrode.

Various types of light emitting devices with at least two light emitting elements such as organic light emitting diodes have recently been developed. Moreover, the substrates of two light emitting elements are bonded to each other so that their light emitting sides are oriented outward. As a result, a double-sided light emitting device enabling the light output on both sides can be formed.

In the US 2004/0036412 A1 a light emitting device is described with two organic electroluminescence layers and electrodes provided alternately on an upper layer of an electrode formed on a substrate respectively, wherein the electrodes provided on a substrate have an anode and a cathode formed alternately.

In the EP 1 575 337 A2 also a double-sided light emitting device is illustrated with two organic light emitting diodes formed on a pair of substrates, wherein the substrates are connected by a bonding layer. The OLEDs (organic light emitting diodes) of said well-known double-sided light emitting devices comprise a bottom emission structure, in which light is obtained through the substrates.

The invention has for its object to improve the above mentioned light emitting device. In particular, it is an object of the present invention to provide a light emitting device with a compact and a simple set-up, wherein color changes of the generated light leaving the light emitting device can be effectuated, easily.

This object is achieved by a light emitting device as taught by claim 1 of the present invention.

Accordingly, a light emitting device is provided, comprising at least a first and a second light emitting element, with the first light emitting element emitting a first light and the second light emitting element emitting a second light, each light emitting element being an OLED, the OLED comprising a sandwich structure with a substrate, a first and a second electrode and an organic layer being provided between the first and the second electrode, and a light leaving the light emitting device, wherein at least a part of said light is provided by a superposition of the first and the second light.

One of the essential ideas of this invention is based on the fact, that at least a part of the first and the second light is mixed. Consequently, the generated light leaving the light emitting device is a product of the first and the second light emitted by said light emitting element. Color changes can be effectuated easily by using OLEDs being positioned back-to-back, which emit light with different wavelengths. In one possible embodiment of the invention a white light leaving the light emitting device can be provided by using a yellow and blue emitting OLED, which are driven by an individual driving circuit, independently.

In a preferred embodiment of the light emitting device the first electrode is positioned between the organic layer and the substrate, wherein the second electrode of the first light emitting element is faced to the second electrode of the second light emitting element. A cavity is provided between the first and the second light emitting elements, whereby the second electrodes of the first and the second light emitting element comprise a defined distance to each other. Preferably, the first electrode is used as an anode and the second electrode is used as a cathode. Both OLEDs can be formed as bottom and top emitting devices. Alternatively, one OLED can have a bottom and a top emitting structure, wherein the second OLED is only a top emitting OLED.

In a possible embodiment of the invention, the second electrode is positioned between the organic layer and the substrate, wherein the substrate of the first light emitting element is faced to the substrate of the second light emitting element, wherein both substrates are optically coupled with a transparent medium. The color-tunable light emitting device comprises two light emitting elements, whose substrates are attached to each other. One light emitting element can be a standard bottom-emitting device, whereas the other one is transparent. By separately biasing both light emitting elements, the overall emitted light leaving the light emitting device can be tuned between the color points of each constituent.

Preferably, the substrate of the first light emitting element comprises a first refractive index $n_1$ and the substrate of the second light emitting element comprises a second refractive index $n_2$, wherein the transparent medium has a refractive index $n_m$, which is almost as large as the refractive index of the first and the second substrate. Advantageously, the transparent medium is a glue that connects both substrates possessing the same refractive index as the substrate. In case of a glass substrate, silicone is a suitable material for the glue.

To increase the light output of the light emitting device at least one scattering element being in contact with the transparent medium is positioned between both substrates. In one preferred embodiment the scattering elements are scattering particles embedded in the transparent medium. The particles inside the transparent medium induce light scattering, which increase the light output and thus the efficiency of both light emitting elements. The scattering element serves as a light out-coupling layer between the two substrates consisting of a coupling medium with scattering particles or structures to enhance light out-coupling of both attached OLED devices.

Advantageously, the particle size of the scattering particles is between 50 nm and 50 µm, preferably between 200 nm and 1000 nm. The scattering particles can consist of a material of a refractive index with suitable contrast to the transparent medium. Suitable materials for the scattering particles are metal oxide like $ZrO_2$, $Y_2O_3$, and $TiO_2$ or sulfides or borates or phosphates or nitrides or oxonitrides or sialones. In one possible embodiment of said inventive device the particle concentration of the transparent medium is between 1%-60%, preferably between 5%-30%. Alternatively, the scattering particles can be phosphor particles, modifying the overall emission spectrum of the light leaving the light emitting device, which is useful for optimization of the color rendering properties.

In another possible embodiment the scattering element is formed as a profiled surface. According to this embodiment the profiled surface can comprise a pyramidal shape, a cone shape or a dome shape or a lens shape refracting or diffracting incident light. Said geometrical surface structure also enhances the light output and the efficiency of the light emitting device.

Advantageously, the transparent medium comprises a refractive index $n_m$ of $n_m > 1.3$, which differs from at least one of the refractive indices of the substrates. In one preferred embodiment at least one surface of the substrate is the profiled surface.

According to a preferred embodiment of the present invention, the cavity is filled with inert gas, which is particularly dry. Alternatively, the cavity can be filled with an inert isolating liquid, which advantageously comprises a getter material or a dispersing material or a phosphor. In one possible embodiment of said inventive device $TiO_2$ can be used as a dispersing material for the isolating liquid. Advantageously, the cavity is encapsulated by the OLED and by an adhesive bonding, which connects the opposing substrates.

In another embodiment it is also possible to fill the cavity with a transparent glue, which can comprise a material including acrylic resins, epoxy resins, polyesters, polyolefins, and the like.

Advantageously, the first and the second electrode of the first and the second light emitting element are transparent or semitransparent. In this case both OLEDs have a top and a bottom emitting structure. According to another preferred embodiment of the light emitting device, the first and the second electrode of the first light emitting element can be transparent, wherein the first electrode of the second light emitting element is reflective and the second electrode of the second light emitting element is transparent. Thus, the first OLED is simultaneously a top and a bottom emitting OLED, emitting the first light toward the bottom face side through the substrate and toward the second OLED. Furthermore, the second OLED is a top emitting OLED only emitting the second light toward the first OLED. To achieve a transparent first and/or second electrode of each OLED the transparent material can comprise ITO, an indium tin oxide. Preferably, a reflective electrode is made of a metal material, which can be an aluminium layer.

In order to change easily the color of the light leaving the light emitting device each OLED is connected with an individual driving circuit. That means, that said OLEDs are driven independently. Advantageously, the OLEDs can display a single color or a plurality of colors. In order to achieve multi-color display, it is apparent that a RGB selective deposition method can be used.

Preferably, the opposing substrates have a distance D to each other being in the range of $1.5\ \mu m \leq D \leq 150\ \mu m$, preferably being in the range of $5\ \mu m \leq D \leq 100\ \mu m$ and more preferably being in the range of $10\ \mu m \leq D \leq 50\ \mu m$. To adjust said distance between both substrates the glue can comprise additives being embedded. The additives can be particles of glass or fiber glass achieving and securing the desired distance between said substrates, wherein a compact and a very thin light emitting double OLED device can be achieved.

Advantageously, the first light emitting element is covered by a first lid and the second light emitting element is covered by a second lid, wherein the first lid is made of a transparent material. Preferably, a first getter element is disposed laterally to the first light emitting element and a second getter element is arranged at the inside of the second lid being faced to the first electrode of the second light emitting element. Under the first and the second lid there is a cavity. The cavity can contain of an inert gas, which is particularly dry. The second getter element can be glued at the inside of the second lid. In this case the second light emitting element is a bottom emitting device, emitting light only in direction to the first light emitting element. In order to enhance the light output two first getter elements are arranged laterally to the first light emitting element.

The light emitting device according to the present invention can be used in a variety of systems amongst them systems being household application systems, shop lighting systems, home lighting systems, accent lighting systems, spot lighting systems, fibre-optics application systems, projection systems, self-lit display systems, pixelated display systems, segmented display systems, warning sign systems, medical lighting application systems, mobile phone display systems, indicator sign systems, or decorative lighting systems.

The light emitting device according to the present invention is particularly configured to generate light for inside and outside providing a sufficient intensity of an effective illumination, whereby the term "light" includes visible and invisible light (e.g. UV, IR) or a combination of both.

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the subclaims and the following description of the respective figures—which in an exemplary fashion—shows different preferred embodiments of the light emitting device according to the invention.

Figure 1:
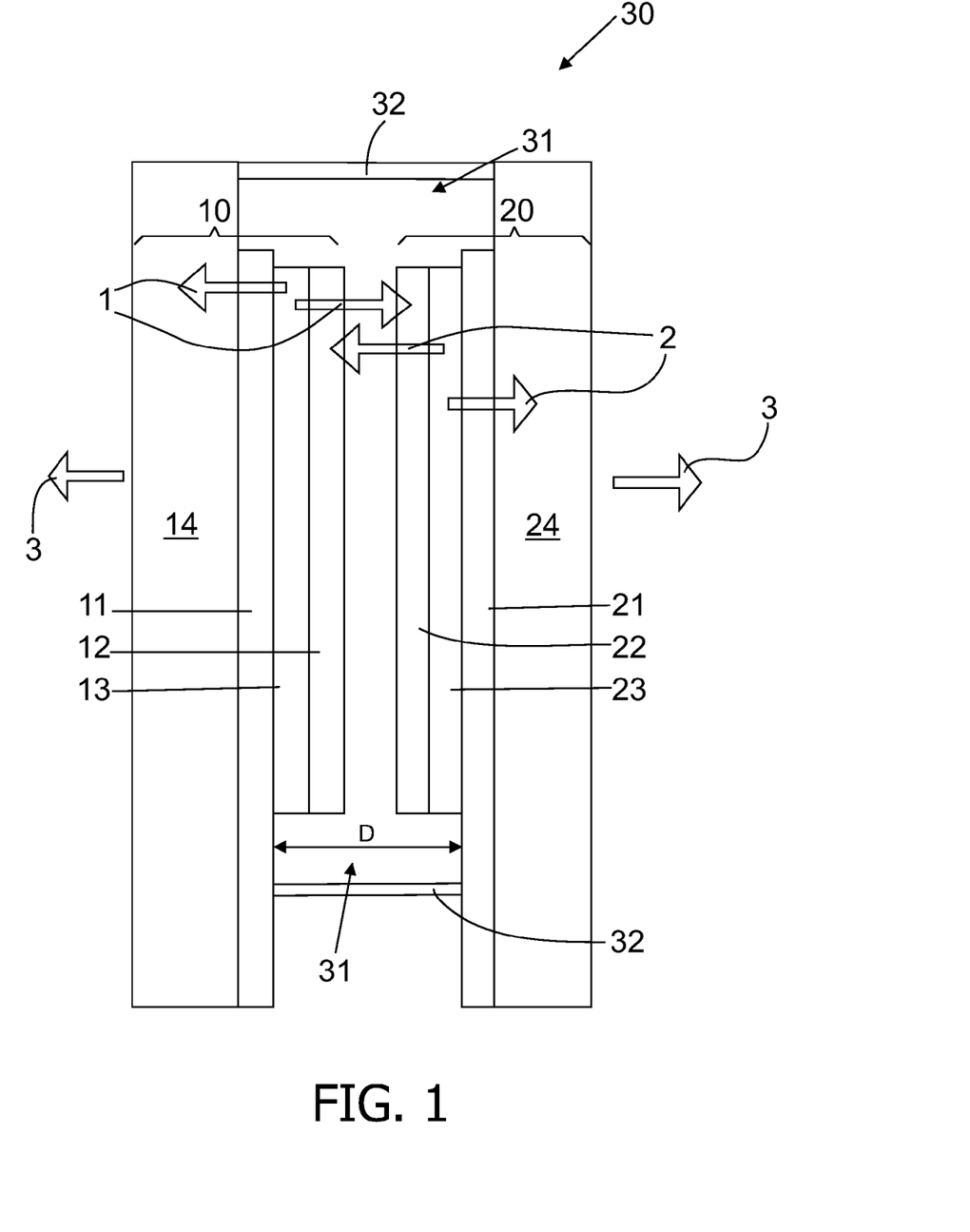
FIG. 1 shows a very schematic view of a light emitting device according to a first embodiment of the present invention.

FIG. 1 illustrates a light emitting device 30 with two OLEDs 10, 20, which are connected by a glue 32 on their backsides. The first 10 and the second OLED 20 consists of a plurality of different thin layers. The first OLED 10 comprises a glass substrate 14, on which an organic layer 13 with a first 11 and a second electrode 12 is precipitated. The organic layer 13 contains a fluorescence or phosphorescence substance to be a component having a light emitting function and emits a light by an electroluminescence phenomenon. The organic layer 13 is positioned between the first 11 and the second 12 electrode. Both electrodes 11, 12 are made of a transparent material including an ITO (indium tin oxide). Thus, the first OLED 10 is simultaneously a bottom and a top emitting light source generating a first light to both sides of the inventive light emitting device.

The second OLED 20 comprises a glass substrate 24, on which the organic layer 23 with the first 21 and the second electrode 22 is positioned. Like the first LED 10 the second LED 20 comprises a multilayer structure, wherein the organic layer 23 is provided between a first 21 and the second electrode 22. Also, the first OLED 10 the second OLED 20 is a top and a bottom emitting light source. That means that the first 21 and the second electrode 22 are made of a transparent material, for example of ITO.

A cavity 31 is provided between both OLEDs 10, 20, wherein the second electrodes 12, 22 of the first 10 and the second light emitting element 20 comprise a defined distance to each other. In the described embodiment of FIG. 1 the cavity 31 is completely closed by the glue 32 and by the OLEDs 10, 20. Therefore, the organic layers 13, 23 with their first 11, 21 and their second electrodes 12, 22 are encapsulated in the cavity 31. In the illustrated embodiments the cavity 31 is filled with an inert gas, which is dry.

By driving the light emitting device 30 the first OLED 10 is emitting a first light 1 being directed to both sides of said light emitting device 30. That means, that the first light 1 is radiated toward the substrate 14 of the first OLED 10 and toward the substrate 24 of the second OLED 20. At the same time the second OLED 20 emits a second light 2 also being directed to both sides of the inventive light emitting device 30. A part of the first light 1 superposes with the second light 2 inside the light emitting device 30. Therefore, at least a part of the light 3 being generated by the light emitting device 30 is provided by an interference of the first 1 and the second light 2.

Figure 2:
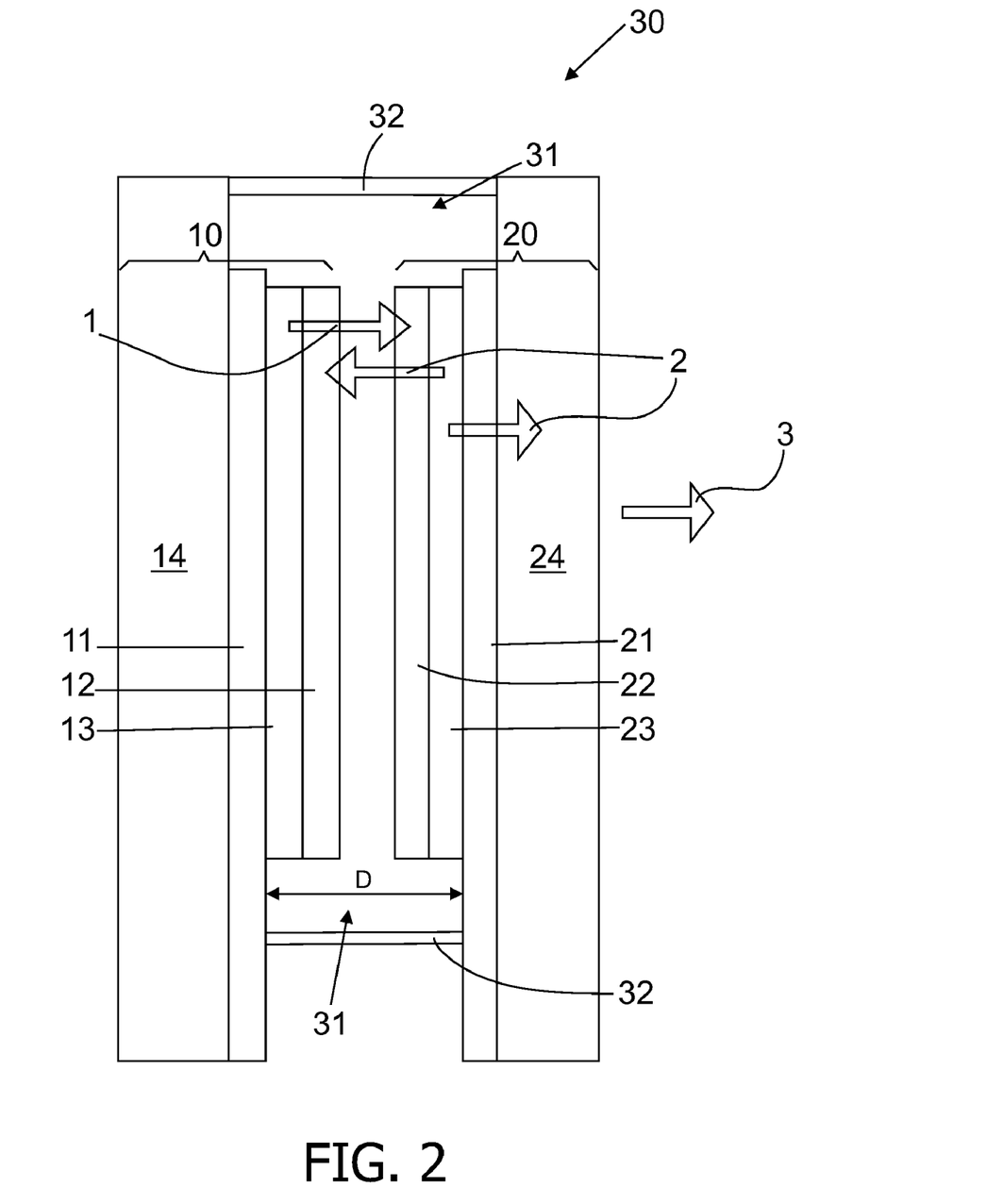
FIG. 2 shows a very schematic view of a light emitting device according to a second embodiment of the present invention.

According to FIG. 2 a light emitting device 30 is illustrated being a double-OLED device with a first 10 and a second OLED 20 like shown in FIG. 1. The only difference to FIG. 1 is that the first OLED 10 comprises a bottom emitting structure. The first electrodes 11 of the first OLED 10 is made of a reflective material, that means that a transmission of light generated within the light emitting device 30 through the first electrode 11 and the substrate 14 to the left side is not possible. The second OLED 20 is transparent, so a first light 1 and a second light 2 can transmit the light emitting device 30 to the right side. Driving the first 10 and the second OLED 20 a part of the second light 2 is superposing with the first light 1. Consequently, a light output 3 is generated by the light emitting device 30, whereby at least a part of said light 3 is provided by a mixture of the first 1 and the second light 2.

According to both embodiments of the present invention the opposing substrates 14, 24 have a distance D to each other, which is in the range of 10 μm≦D≦50 μm. To provide said distance D the glue 32 comprises additives—not shown —, which are embedded in the glue material.

Figure 3:
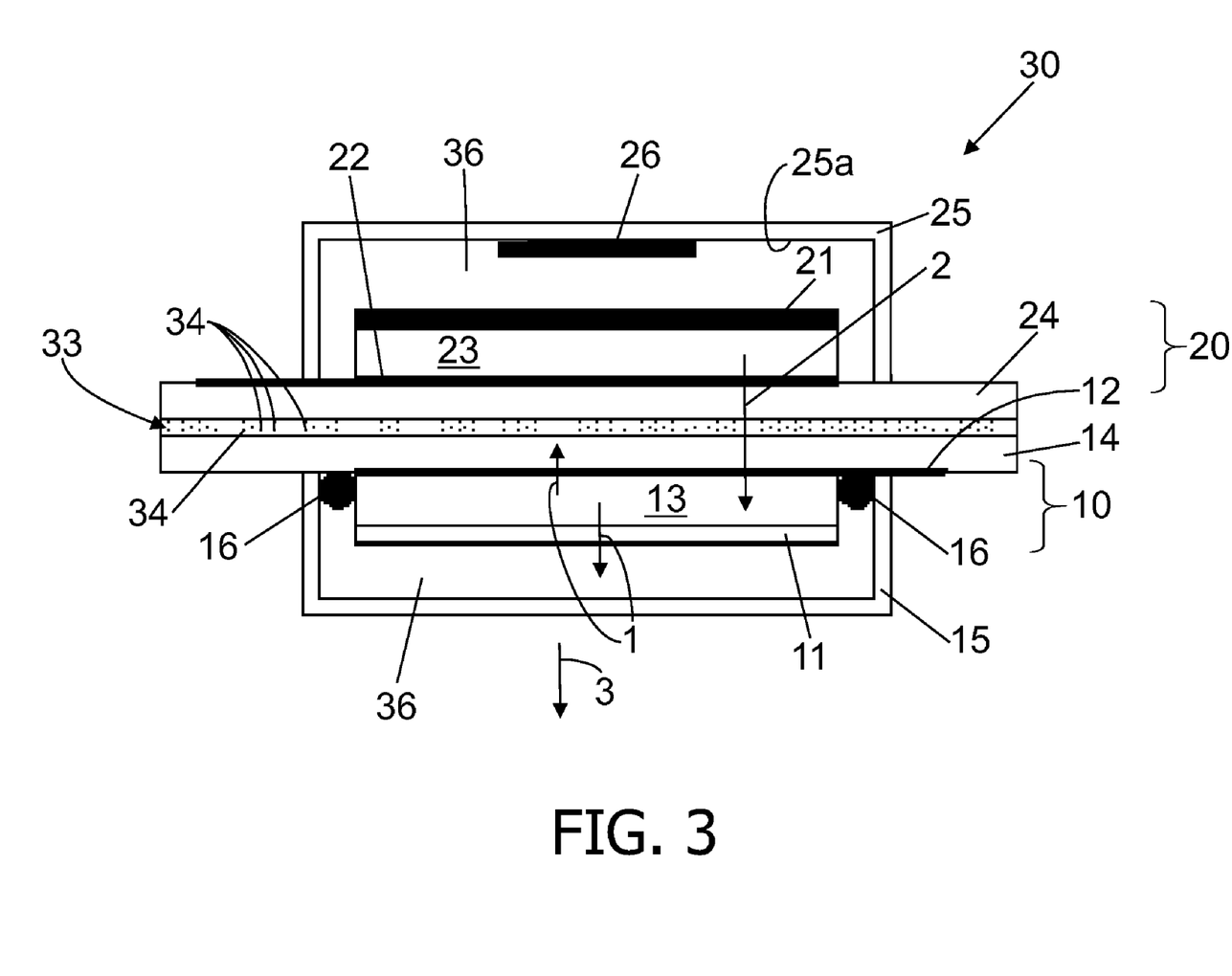
FIG. 3 shows an alternative embodiment of a light emitting device.

FIG. 3 shows an alternative embodiment of a light emitting device 30, wherein two light emitting elements 10, 20 are attached to each other. The first light emitting element 10 is a transparent OLED, comprising a first 11 and a second electrode 12, which are transparent. Between both electrodes 11, 12 an organic layer 13 is positioned. The second electrode 12 is in contact with a substrate 14. The first light emitting element 10 emits a first light 1 to both sides. On the one hand the first light 1 leaves the first light emitting element 10 in direction to the second light emitting element 20. On the other hand the first light 1 is directed to the bottom. The second light emitting element 20 is arranged on the first light emitting element 10, which consists of an organic layer 23. The organic layer 23 is positioned between a first 21 and a second electrode 22. The second electrode 22 is in contact with a substrate 24. Both OLEDs 10, 20 are glued to each other with their substrate 14, 24.

The first electrode 21 of the OLED 20 is made of a material, which is reflective. Thus, the OLED 20 is a bottom-emitting device, which produces a second light 2, which leaves the OLED 20 in direction to the first light emitting element 10. In the shown embodiment of FIG. 3 the first light emitting element 10 produces yellow light 1 and the second light emitting element 20 produces blue light 2. Via superposition of the first 1 and the second light 2 a light 3 leaves the light emitting device 30, which is a white light 3.

Both OLEDs 10, 20 are covered by a first lid 15 and a second lid 25, wherein the first lid 15 of the OLED 10 is made of a transparent material. The second lid 25 can be made of a metal. Of course, the second lid 25 can be transparent as well. In one possible embodiment of the invention both lids 15, 25 are made of glass. Under both lids 15, 25 there is a cavity 36, which is filled with inert gas. At the inside 25a of the second lid 25 a getter element 26 is arranged. The getter element 26 is faced to the first electrode 21 of the OLED 20, wherein said getter element 26 has a planar structure.

An additional getter element 16 is disposed laterally to the first light emitting element 10, in order to avoid absorptions inside the first light emitting element 10. During the operation of the light emitting device 30 a first amount of the first light 1 is directed to the first lid 15, directly. A second amount of the first light 1 leaves the first light emitting element 10 in direction to the second light emitting element 20. The first light 1 is reflected at the first reflective electrode 21. After the reflection the first light 1 is directed to the first light emitting element 10, again. In order to enhance the light output of both OLEDs 10, 20 the glue 33 is a transparent medium containing scattering elements 34. The scattering elements 34 are small particles 34 embedded in the transparent medium 33. In the shown embodiment of FIG. 3 the connecting glue 33 is a silicone layer of 100 μm thickness. The scattering elements 34 are metal oxide. Concerning the embodiment of FIG. 3 the scattering particles are made of $ZrO_2$. The particle concentration of $ZrO_2$ is 1% (volumetric content). The reflective index of said scattering particles 34 is 2.2. The average particle size is 500 nm.

Both organic layers 13, 23 have a multilayer structure, which is not described, explicitly. The first light emitting element 10 consists of following materials: glass (substrate); Indium Tin Oxide ITO (second electrode); α-NPD:$MoO_3$ (3:1), 20 nm/α-NPD, 50 nm/CBP:Ir(ppy)$_3$ (8%), 15 nm/CBP: ADS-076 (8%), 15 nm/BAlq, 30 nm (organic layer(s)); LiF, 1 nm/Al, 1.5 nm/Ag, 10 nm (first electrode).

The second light emitting element 20 consists of following materials: glass (substrate), Indium Tin Oxide ITO (second electrode); α-NPD, 50 nm/TBADN:DPAVBi (4%), 20 nm/Alq$_3$, 30 nm (organic layer(s)); LiF, 1 nm/Al, 100 nm (first electrode).

Figure 4:
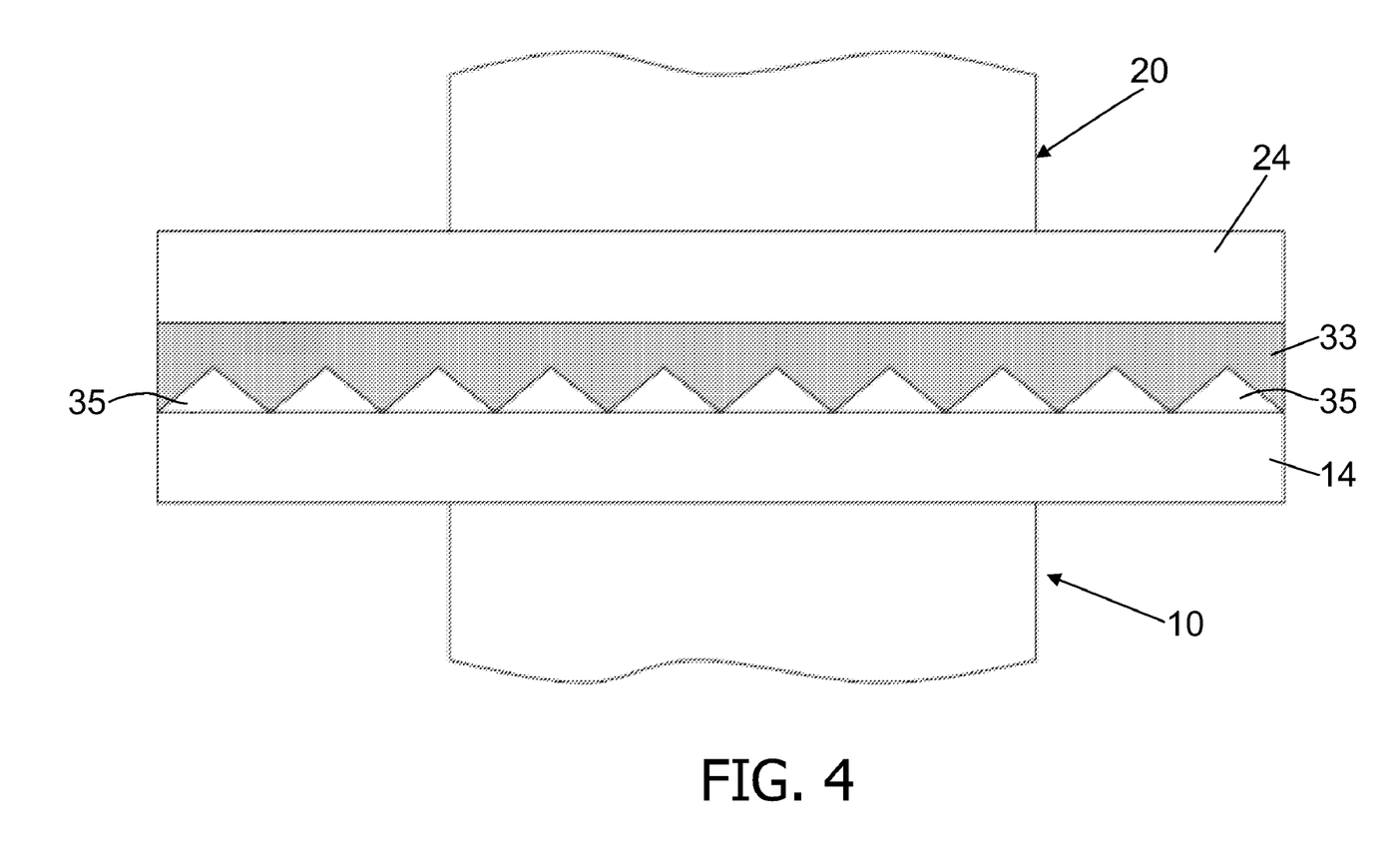
FIG. 4 shows a very schematic view of an another possible embodiment of a light emitting device.

In an alternative embodiment of the invention the scattering element 35 between both substrates 14, 24 is formed as a profiled surface 35, which is shown in FIG. 4. The assembly of the light emitting device 30, in particular of the first and the second light emitting element 10, 20 is more or less the same but instead of the scattering particles 34 embedded in the transparent medium 33 the profiled surface 35 enhances the light output of both light emitting elements 10, 20. The transparent medium 33 is a glue, wherein the profiled surface 35 comprises an array of various shapes, shown in FIGS. 5a to 5e.

Figure 5A:
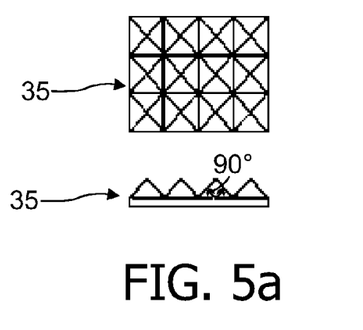
FIG. 5a shows a first possible embodiment of a scattering element being positioned between both substrates according to FIG. 4.
Figure 5B:
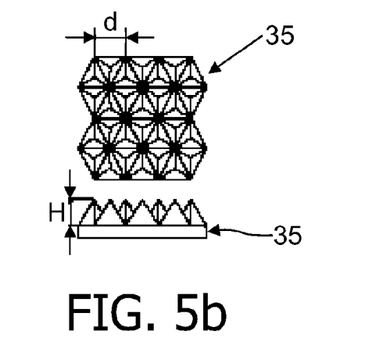
FIG. 5b shows a second possible embodiment of a scattering element being positioned between both substrates according to FIG. 4.
Figure 5C:
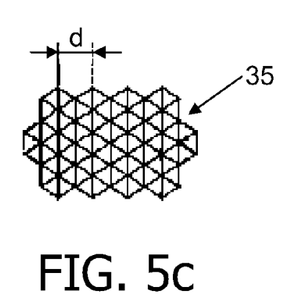
FIG. 5c shows a third possible embodiment of a scattering element being positioned between both substrates according to FIG. 4.
Figure 5D:
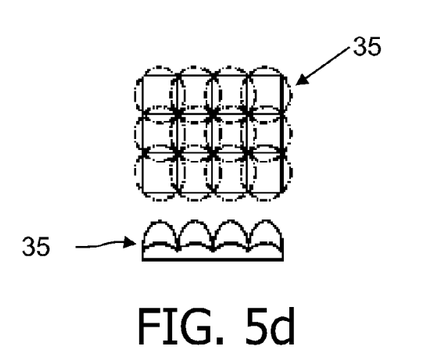
FIG. 5d shows a fourth possible embodiment of a scattering element being positioned between both substrates according to FIG. 4
Figure 5E:
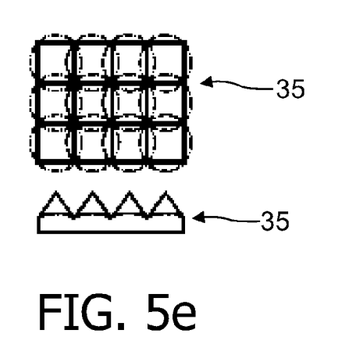
FIG. 5e shows a fifth possible embodiment of a scattering element being positioned between both substrates according to FIG. 4.

In FIG. 4 the profiled surface 35 comprises a pyramid array, wherein the refractive index $n_m$ of the connecting medium 33, differs from at least one of the refractive indices of the substrates 14,24, preferably from the substrate 14 with the profiled surface. The profiled surfaces 35 are microstructures, wherein square pyramids (FIG. 5a), triangle pyramids (FIG. 5b), hexagonal pyramids (FIG. 5c), ellipsoidal domes (FIG. 5d) or cones (FIG. 5e) are possible. Concerning said pyramid structures the heights H of each pyramid is approximately 150 μm. The apex angle shown in FIG. 5a is 90°.

The tip distance d between two adjacent pyramids is approximately 300 μm. The array of the refractive surface 35 is embedded in the not shown transparent medium having a maximum thickness between valley and flat surface 1 of 250 μm.

LIST OF NUMERALS 1 first light
2 second light
3 light
10 first light emitting element, OLED
11 first electrode
12 second electrode
13 organic layer
14 substrate
15 first lid
16 first getter element
20 second light emitting element, OLED
21 first electrode 22 second electrode
23 organic layer
24 substrate
25 second lid
25a inside of a second lid
26 second getter element
30 light emitting device
31 cavity
32 glue
33 transparent medium, glue
34 scattering particles
35 profiled surface
cavity

The invention claimed is:

1. A light emitting device having at least a first and a second light emitting element, with
the first light emitting element emitting a first light and the second light emitting element emitting a second light,
each light emitting element being an OLED,
the OLED comprising a sandwich structure with a substrate, a first and a second electrode and an organic layer being provided between the first and the second electrode, the organic layer comprising an organic material capable of emitting light, and
a light leaving the light emitting device, wherein at least a part of said light is provided by a superposition of the first and the second light,
wherein:
the second electrode of the first or the second light emitting element is positioned between the organic layer and the substrate of the first or second light emitting element, respectively,
the substrate of the first light emitting element is faced to the substrate of the second light emitting element,
both substrates are optically coupled with a transparent medium,
the substrate of the first light emitting element comprises a first refractive index $n_1$ and the substrate of the second light emitting element comprises a second refractive index $n_2$, and
the transparent medium has a refractive index $n_m$, which is less than the refractive index of the first and the second substrate.

2. A light emitting device having at least a first and a second light emitting element, with
the first light emitting element emitting a first light and the second light emitting element emitting a second light,
each light emitting element being an OLED,
the OLED comprising a sandwich structure with a substrate, a first and a second electrode and an organic layer being provided between the first and the second electrode, the organic layer comprising an organic material capable of emitting light, and
a light leaving the light emitting device, wherein at least a part of said light is provided by a superposition of the first and the second light,
wherein:
the second electrode of the first or the second light emitting element is positioned between the organic layer and the substrate of the first or second light emitting element, respectively,
the substrate of the first light emitting element is faced to the substrate of the second light emitting element,
both substrates are optically coupled with a transparent medium, and
at least one scattering element in contact with the transparent medium is positioned between both substrates.

3. A light emitting device as claimed in claim 2, characterized in that the scattering element includes scattering particles embedded in the transparent medium.

4. A light emitting device according to claim 1, characterized in that the refractive index $n_m$ is between 1.1 and 2.0.

5. A light emitting device according to claim 3, characterized in that the particle size of the scattering particles is between 50 nm and 50 µm.

6. A light emitting device according to claim 2, characterized in that the particle concentration of the scattering element is between 1%-60%.

7. A light emitting device as claimed in claim 2, characterized in that the scattering element is formed as a profiled surface.

8. A light emitting device as claimed in claim 7, characterized in that the profiled surface comprises a pyramidal shape, a cone shape or a dome shape or a lens shape refracting or diffracting incident light.

9. A light emitting device as claimed in claim 7, characterized in that the transparent medium comprises a refractive index $n_m$ wherein $n_m > 1.3$, which differs from at least one of the refractive indices of the substrates.

10. A light emitting device according to claim 1, characterized in that at least one surface of the substrates is a profiled surface.

11. A light emitting device according to claim 1, characterized in that the first and the second electrode of the first and the second light emitting element are transparent.

12. A light emitting device according to claim 1, characterized in that the first and the second electrode of the first light emitting element are transparent, wherein the first electrode of the second light emitting element is reflective and the second electrode of the second light emitting element is transparent.

13. A light emitting device according to claim 11, characterized in that the transparent electrodes comprising ITO (indium tin oxide).

14. A light emitting device according to claim 12, characterized in that the reflective electrodes are an aluminium layer.

15. A light emitting device according to claim 1, characterized in that each of the first and the second light emitting element is connected with an individual driving circuit.

16. A light emitting device according to claim 2, characterized in that the substrates have a distance D to each other being in the range of 1.5 µm ≦ D ≦ 150 µm.

17. A light emitting device as claimed in claim 1 wherein the first light emitting element and the second light emitting element are positioned back-to-back such that light emitted by the organic layer of the first light emitting element is emitted through the organic layer of the second light emitting element.

18. A light emitting device as claimed in claim 2 wherein the first light emitting element and the second light emitting element are positioned back-to-back such that light emitted by the organic layer of the first light emitting element is emitted through the organic layer of the second light emitting element.

* * * * *